United States Patent
Hirler et al.

(10) Patent No.: US 7,436,023 B2
(45) Date of Patent: Oct. 14, 2008

(54) HIGH BLOCKING SEMICONDUCTOR COMPONENT COMPRISING A DRIFT SECTION

(75) Inventors: Franz Hirler, Isen (DE); Anton Mauder, Kolbermoor (DE); Frank Pfirsch, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/464,004

(22) Filed: Aug. 11, 2006

(65) Prior Publication Data

US 2007/0052058 A1    Mar. 8, 2007

Related U.S. Application Data

(63) Continuation of application No. PCT/DE2005/000241, filed on Feb. 11, 2005.

(30) Foreign Application Priority Data

Feb. 13, 2004    (DE) ........................ 10 2004 007 197

(51) Int. Cl.
*H01L 23/58*    (2006.01)
(52) U.S. Cl. .................. 257/328; 257/374; 257/501; 257/506; 257/E29.02
(58) Field of Classification Search ................ 257/328, 257/374, 501, 506, E29.02
See application file for complete search history.

(56) References Cited

U.S. PATENT DOCUMENTS

| | | | |
|---|---|---|---|
| 4,754,310 A | 6/1988 | Coe | 357/13 |
| 4,890,150 A | 12/1989 | Vera et al. | 357/52 |
| 4,941,026 A | 7/1990 | Temple | 357/23.4 |
| 5,216,275 A | 6/1993 | Chen | 257/493 |
| 5,998,833 A | 12/1999 | Baliga | 257/329 |
| 6,031,058 A * | 2/2000 | McIntosh et al. | 526/171 |
| 6,201,279 B1 | 3/2001 | Pfirsch | 257/333 |
| 2002/0008268 A1* | 1/2002 | Babcock et al. | 257/302 |
| 2002/0114932 A1* | 8/2002 | Yoshikawa et al. | 428/210 |

(Continued)

FOREIGN PATENT DOCUMENTS

DE    19840032 C1    9/1998

(Continued)

OTHER PUBLICATIONS

T. Fujihira et al., "Simulated Superior Performances of Semiconductor Superjunction Devices," ISPSD, pp. 423-426, 1998.

(Continued)

*Primary Examiner*—Evan Pert
*Assistant Examiner*—Tan N Tran
(74) *Attorney, Agent, or Firm*—Coats & Bennett, P.L.L.C.

(57) ABSTRACT

A semiconductor component having a drift path (2) which is formed in a semiconductor body (1), is composed of a semiconductor material of first conductance type. The drift path (2) is arranged between at least one first and one second electrode (3, 4) and has a trench structure in the form of at least one trench (18). A dielectric material which is referred to as a high-k material and has a relative dielectric constant $\epsilon_r$ where $\epsilon_r \geq 20$ is arranged in the trench structure such that at least one high-k material region (5) and one semiconductor material region (6) of the first conductance type are arranged in the area of the drift path (2).

49 Claims, 8 Drawing Sheets

U.S. PATENT DOCUMENTS

2003/0006458 A1* 1/2003 Terashima .................. 257/335
2003/0047768 A1 3/2003 Disney ....................... 257/302
2005/0116284 A1* 6/2005 Chen .......................... 257/329

FOREIGN PATENT DOCUMENTS

| WO | 02067332 A2 | 8/2002 |
|---|---|---|
| WO | 03044864 A1 | 5/2003 |
| WO | 2004102670 A2 | 11/2004 |

OTHER PUBLICATIONS

H.-R. Chang et al., "1200V, 50A Trench Oxide PiN Schottky (TOPS) Diode," IEEE, Industry Applications Conferemce, XP001016855, pp. 353-358, 1999.

PCT International Preliminary Report on Patentability w/English translation, PCT/DE2005/000241, 10 pages, Mailing Date Oct. 12, 2006.

* cited by examiner

HIGH BLOCKING SEMICONDUCTOR COMPONENT COMPRISING A DRIFT SECTION

CROSS-REFERENCE TO RELATED APPLICATION

This application is a continuation of co-pending International Application No. PCT/DE2005/000241 filed Feb. 11, 2005 which designates the United States, and claims priority to German application number DE 10 2004 007 197.7 filed Feb. 13, 2004.

TECHNICAL FIELD

The present invention relates to a semiconductor component having a drift path which is formed in a semiconductor body and is composed of a semiconductor material of a first conductance type, across which a voltage which is applied between at least one first and one second electrode of the semiconductor body is dropped.

BACKGROUND

In the case of conventional power transistors, for example, the breakdown voltage Vbr(V) and the forward resistance Ron★A($\Omega cm^2$) of the drift path depend on the one hand on the doping concentration of foreign substances in the drift path, and on the other hand on the length of the drift path, where Ron is the value of the resistance formed by the drift path, and A is the cross-sectional area of the resistance formed by the drift path. The expression drift path means that region in the semiconductor body of the semiconductor component across which the major proportion of the breakdown voltage is dropped.

A high doping concentration in the drift path and its short configuration lead to a low forward resistance, and to a low permissible reverse voltage. Conversely, a low doping concentration in the drift path and its long extent result in a high permissible reverse voltage and a high forward resistance. Against this background, the problem is to achieve a high permissible reverse voltage and a low forward resistance for high blocking capability semiconductor elements having a drift path.

This problem is partially solved by so-called compensation components, such as CoolMOS transistors, in which additional p-doped regions are arranged in the drift path such that, when in the forward-biased state, they do not significantly impede the current flow between the source electrode and the drain electrode, but largely compensate for the charge in the drift path when the space charge zone is in the reverse-biased state. The introduction of these additional p-doped regions with the opposite charge polarity to the drift path prevents the charges in the drift path from producing an excessively high electrical field. One disadvantage of this solution is that it is complex to produce such p-doped regions in an otherwise n-doped drift path.

DE 198 40 032 C1 discloses a modification of this compensation component, in which the doping in the drift path and/or in the compensation regions can be set such that, when reverse-biased, the electrical field has a profile which rises from both sides of the drift path. The maximum electrical field strength is thus not reached in the vicinity of one end of the drift path, but in its interior, for example approximately at the center. In the case of n-conductive components, for example, in the source-end area of the drift path, the p-doped compensation regions may be more highly doped for this purpose, while those in the drain-end area of the drift path may be more lightly doped than the n-doped drift path. This can be achieved not only by vertical variation of the doping in the compensation regions, but also by vertical variation of the doping in the drift path. Components such as these are distinguished by high avalanche resistance as well as a current load capacity in breakdown, and by increased tolerance to manufacturing fluctuations. Nevertheless, the manufacturing effort remains considerable.

The document WO 02/067332A2 discloses a trench structure which is introduced into the drift path and whose walls have an insulating layer, with the trench structure being filled with a semi-insulating material, preferably polysilicon. This design makes it possible to improve the electrical field distribution in the drift path so as to allow heavier doping in the drift path without excessive field strength peaks occurring in the depth of the reverse-biased pn junction, which would reduce the blocking voltages. Oxides, preferably silicon oxides, are arranged on the trench walls as the dielectric insulation material. One disadvantage is that, when reverse-biased, a considerable leakage current can flow via the semi-insulating layer arranged in the drift path. This becomes greater the more effectively the semi-insulating layers in the trench structure influence the profile of the electrical field in the drift path.

Finally, US 2003/0047768 discloses the profile of the electrical field in the drift path being influenced with the aid of field plates, which are introduced into a trench structure, in such a way that heavier doping can be provided in the drift path. A field plate such as this can be arranged in a trench structure, such as it is isolated from its semiconductor body, in the case of vertical semiconductor components. However, the amount of effort for production of a semiconductor component such as this is relatively high. In addition, the required thickness of isolation layers between the semiconductor body of the semiconductor component and the field electrodes increases in proportion to the desired breakdown voltage. For this reason, this trench structure is sensibly applicable in practice in semiconductor components only up to maximum blocking voltages of 200 V.

SUMMARY

A semiconductor component may comprise a drift path which is formed in a semiconductor body and composed of a semiconductor material of a first conductivity type and comprises a trench structure, which is arranged between at least one first and one second electrode and at least along a part of the drift path, in the form of at least one trench, wherein a dielectric material which is referred to as a high-k material and comprises a relative dielectric constant $\epsilon_r$, where $\epsilon_r \geq 20$ being arranged in the trench structure such that at least one high-k material region and one semiconductor material region of the first conductivity type are arranged in the area of the drift path.

BRIEF DESCRIPTION OF THE DRAWINGS

The invention will be explained in more detail in the following text with reference to the figures, in which.

DETAILED DESCRIPTION

Figure 1:
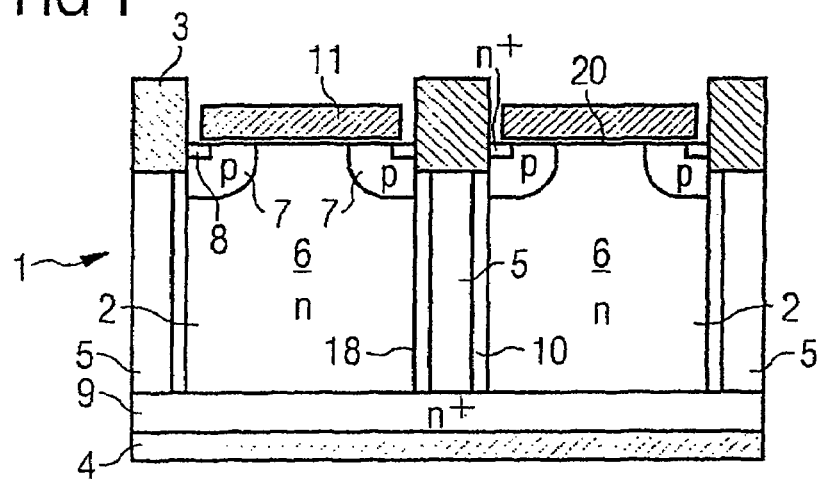
FIG. 1 shows a section illustration of a power MOSFET according to an embodiment.

The doping in the drift path of a semiconductor component in an embodiment can be increased further while nevertheless not reducing the permissible blocking voltage, and which in addition can be produced relatively easily. A semiconductor component is provided having a drift path which may be formed in a semiconductor body. The drift path may have a semiconductor material of a first conductance type and extends between at least one first and one second electrode. A trench structure in the form of at least one trench can be arranged along a part of the drift path. A dielectric material which is referred to as a high-k material and has a relative dielectric constant $\epsilon_r$ where $\epsilon_r \geq 20$ can be arranged in the trench structure such that a high-k material region and at least one semiconductor material region of the first conductance type of the drift path are arranged in the area of the drift path.

The embodiments advantageously can make use of the discovery that the doping in the drift path when reverse-biased produces an electrical field in the space charge zone. If $\rho = q \cdot N_D$ ($\rho$=specific charge in the space charge zone, q=elementary charge, $N_D$=number of donors per unit volume in the space charge zone) then, as is known and in accordance with Maxwell's first equation, the electrical field E in the semiconductor material is:

$$div\, E = \rho / \epsilon_H \epsilon_0 \qquad (1)$$

where $\epsilon_H$=relative dielectric constant $\epsilon_r$ in the semiconductor material, in particular silicon, and $\epsilon_0$=electrical field constant. The electrical field constant $\epsilon_0$ is also referred to as the dielectric constant of the vacuum, and the relative dielectric constant $\epsilon_r$ is also referred to as the dielectric coefficient. The product $\epsilon_H \epsilon_0$ is the (absolute) dielectric constant of the semiconductor material.

It follows from this, that when the electrical field E is the same, the donor density and thus the doping can be chosen to be higher and heavier, respectively, with the aid of a higher dielectric constant $\epsilon_r$. In other words, if it is ensured that the dielectric constant $\epsilon_r$ in the semiconductor material of the drift path becomes greater, then the doping concentration can also be increased there without this resulting in an increase in the electrical field strength. This relationship can be used by arranging regions with a very high dielectric constant $\epsilon_r$ in parallel with the drift path, so that, on average, this results in a higher effective value of the dielectric constant for the area of the drift path overall, over the drift path including these additional regions.

One or more so-called high-k material regions can advantageously be provided alternately with semiconductor material regions which form the actual drift path, in the drift path and along it. In conventional semiconductor components, the upper limit of the doping concentration in the drift path for a blocking capability of about 600 V in silicon is about $1.5E14$ $cm^{-3}$ In contrast, in the case of the semiconductor component according to an embodiment, the drift path has a doping concentration of about $2E15\,cm^{-3}$ to $2E16\,cm^{-3}$. It is thus one to two orders or magnitude greater than in the case of conventional semiconductor components.

Thus, when forward-biased, the drift path has a very low resistance in comparison to known semiconductor components as mentioned above, because of the heavily doped drift path. During blocking, the dopants in the drift path are ionized in the area of the space charge zone and, without the additional high-k regions, would intrinsically produce an electrical field in the order of magnitude of the breakdown field strength even when a very low voltage is applied to the two electrodes, of 20 V to 150 V depending on the doping concentration. The high-k material in the additional regions is, however, very heavily polarized as a result of the high dielectric constant, and together with the polarization charges produced in consequence compensates for a large proportion of the charges in the semiconductor material in the drift path, and thus also for the electrical field.

The resultant field in the vertical direction between the two electrodes can be calculated approximately using the above equation (1) by replacing $\epsilon_H$ by the mean value of the respective dielectric constants $\epsilon_r$ weighted with the widths of the semiconductor material regions of the drift path and of the additional high-k material regions. Correct operation during blocking requires that the doping concentration in the semiconductor material regions in the drift path in the lateral direction be not more than twice the breakdown charge.

One advantage of the semiconductor component according to an embodiment is that the magnitude of the doping concentration in the semiconductor material regions in the drift path need be set only with the normal accuracy, because, in contrast to the situation with the known semiconductor elements mentioned above, there is no need to ensure accurate charge compensation, and all that is relevant is to set the forward resistance. Furthermore, it is possible to choose an isolator for the high-k material in the additional regions as well such that the semiconductor component according to an embodiment does not have an increased leakage current, in contrast to the semiconductor components mentioned above. If the high-k material has a (low) electrical conductivity, then its upper limit is governed by the permissible leakage current.

The high-k material may have a dielectric constant $\epsilon_r$ of $\epsilon_r \geq 20$, preferably $\epsilon_r \geq 200$ and particularly preferably $\epsilon_r \geq 1000$. Materials provided for this purpose are, for example, hafnium dioxide (HfO$_2$), zirconium dioxide (ZrO$_2$), titanium dioxide (TiO$_2$) or lanthanum oxide (La$_2$O$_3$), or a compound from the group of titanates, in particular such as barium titanate, strontium titanate or barium-strontium titanate. In addition, zirconates, niobates and tantalates are also considered.

Furthermore, the dielectric constant $\epsilon_r$ of the high-k material should be at least twice as great as the dielectric constant $\epsilon_H$ of the semiconductor material in the drift path. In combination with other solutions, such as compensation structures in wall areas of the trench structure, it is actually advantageous for the dielectric constant $\epsilon_r$ to be greater than that of the semiconductor material.

A further advantage of the semiconductor component according to an embodiment is also that the structure provided in it can be scaled for higher voltages without any problems, by increasing the length of the drift path and of the additional high-k material regions. It is thus possible to use the semiconductor component according to an embodiment over a very wide range of voltage classes, for example between about 100 V and 2000 V.

The semiconductor component according to an embodiment may also have structures for charge compensation, corresponding to the above first method. It then has the advantage that, with a considerably reduced forward resistance, the magnitude of the doping concentration need not be set as accurately as in the case of pure compensation components.

A value range from 1 µm to 10 µm, and preferably from about 2 µm to 4 µm, can be provided for the width of the drift path. As has already been mentioned above, the length of the drift path depends on the desired blocking voltage, and is approximately 40 µm for a voltage of about 600 V in silicon.

The extent of the semiconductor material regions from one high-k material region to a next high-k material region, that is to say the extent in the lateral direction at right angles to the connection direction between the two electrodes, should advantageously not be more than about ⅓ of the extent of the semiconductor material regions in the current-flow direction between the two electrodes.

The semiconductor component according to an embodiment may, for example, be a MOSFET (MOS field-effect transistor), a JFET (junction field-effect transistor) or a Schottky diode. However, the embodiments are not restricted to these components and in fact can also be used for other semiconductor components, such as IGBTs ("isolated gate bipolar transistors"), thyristors, etc.

An isolator layer may be provided at least in places between the high-k material region and the semiconductor material region of the semiconductor body in the drift path. By way of example, silicon dioxide, silicon nitride, aluminum oxide or titanium dioxide, or a stack composed, for example, of a silicon-dioxide film and at least one further film, for example composed of silicon nitride, may be chosen for the isolator layer.

Particularly in the case of vertical semiconductor components, the high-k material region may be arranged at least in places in a trench as a trench structure. A trench such as this can be incorporated without any problems in the semiconductor body of the semiconductor component, for example by means of etching.

If the high-k material region is provided in a trench, then this trench need not be completely filled with the high-k material. In fact, the trench may also additionally contain insulating material.

Suitable trench structures for the high-k material regions, when shown in a plan view, comprise a strip structure, a grating structure or a column structure. The two latter may, for example, be square or hexagonal.

The doping concentration in the drift path should (integrated between two high-k material regions, in a direction at right angles to the main direction of the electrical field between the first and the second electrode when a reverse voltage is applied to these electrodes, and at right angles to the boundary surface between the semiconductor material regions and the high-k material regions) not be greater than twice the breakdown charge when the high-k material regions have a strip structure, and not greater than four times the breakdown charge when they have a grating structure. It should be noted that the breakdown charge is linked to the breakdown field strength via the above equation (1).

The semiconductor component may have a vertical structure or a lateral structure. If it has a lateral structure, then the high-k material regions can be introduced into trenches and may extend laterally between the drain and source, or anode and cathode, or may lie on the semiconductor structure.

The high-k material may be a uniform material or an assembled material. If it is an assembled material, then it may have conductive areas which are surrounded by a dielectric. The conductive areas may in this case be irregularly or regularly arranged material areas or else material layers.

The semiconductor material of the semiconductor body may be composed of homogenous semiconductor material, in particular such as silicon, silicon carbide, gallium arsenide, gallium nitride, carbon or heterogenous semiconductor material, in particular such as Si/SiGe, GaAs/AlGaAs, GaN/AlGaN, GaAs/InGaAsP or of organic or inorganic material. In other words, any semiconductor material which is suitable for this purpose may be chosen for the semiconductor component.

If the semiconductor component is a transistor, then a highly conductive or metallic layer may be provided in the area of that side electrode which is opposite one semiconductor surface of the semiconductor body, that is to say on the drain side, between the high-k material and the semiconductor material of the semiconductor body. This layer then makes contact with both the high-k material as a capacitance electrode and with the semiconductor material, and can act as a diffusion barrier between the high-k material and the semiconductor body.

FIG. 1 shows a power MOSFET according to a first embodiment.

A semiconductor body 1 composed of silicon or some other suitable semiconductor material, as stated above, comprises an n-conductive drift path 2, a p-conductive body zone 7 and a conductive source zone 8. An n-conductive region 9 is furthermore also provided adjacent to the drain electrode, and may also be metallically conductive.

It should expressly be noted that it is also possible to provide the opposite conductance types in each case, instead of the stated conductance types. This means that the n-conductance type may be replaced by the p-conductance type, when the n-conductance type is provided instead of the p-conductance type. For example, the source zone 8 may thus be p-conductive when the body zone 7 is n-conductive, with the p-conductance type being used for the drift path 2.

A source/body electrode 3 and a drain electrode 4 are also provided on the semiconductor body 1, and may be composed of aluminum or of some other suitable material.

According to an embodiment, a trench structure in the form of trenches 18 is incorporated in the semiconductor body 1, with high-k material regions 5 composed of hafnium dioxide, zirconium dioxide, titanium dioxide or lanthanum oxide, or a compound from the group of titanates, zirconates, niobates or tantalates being provided in this trench structure. The high-k material may also be separated from the semiconductor material region 6 of the drift path 3 by means of an isolator layer 10.

Figure 11:
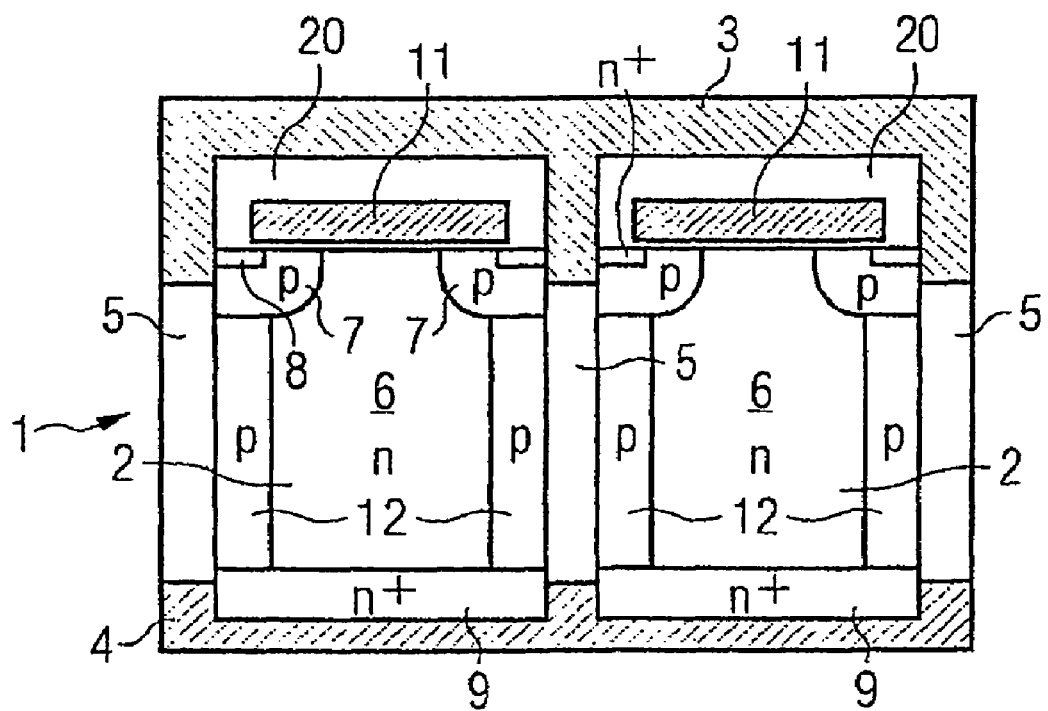
FIG. 11 shows a section illustration through a power MOSFET according to a further embodiment, with approximately compensating n-doped and p-doped regions in the drift path and layers composed of a material with a high dielectric constant, which is connected directly to the metallization or metallic material on the front face and rear face.

A gate electrode 11 composed, for example, of polycrystalline silicon is also embedded in an isolator layer 20 (in this context see also FIG. 11), which is not illustrated in any more detail in FIG. 1 but is composed, for example, of silicon dioxide, silicon nitride or some other insulating material.

The doping concentration in the drift path 2 is about 2E15 $cm^{-3}$ to 1E17 $cm^{-3}$. The width of the drift path 2 between two trenches 18 is in the range from 1 μm to 10 μm, and is preferably 2 μm to 4 μm. The length of the drift path between the two surfaces of the semiconductor body 1 depends on the desired breakdown voltage and, if this is intended to be about 600 V, is approximately 40 μm in silicon.

Any of the materials mentioned above may be chosen for the high-k material for the regions 5. This high-k material should have a higher dielectric constant $\epsilon_r$ than the material of the semiconductor body, for example at least $\epsilon_r \geq 20$. Higher values, such as $\epsilon_r \geq 200$ or $\epsilon_r \geq 1000$, are, however, preferable.

The regions 5 are adjacent to the n-conductive region 9 and, on the source side, make direct contact with the source potential on the source electrode 3.

Any suitable insulator material such as silicon dioxide, silicon nitride, aluminum oxide or titanium dioxide, or a stack composed of a plurality of films, may be chosen for the isolator layer 10.

The trenches 18 may be incorporated without any problems in the semiconductor body 1, by means of etching. They are then clad on their side walls, with the isolator layer 10, and are filled with the appropriate high-k material for the regions 5.

Figure 1A:
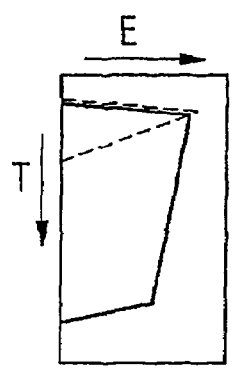
FIG. 1A shows the profile of the electrical field for a conventional MOSFET (dashed line) and for the MOSFET according to an embodiment as shown in FIG. 1 (solid line)

FIG. 1A shows, schematically, the profile of the electrical field E as a function of the depth T between the two main surfaces of the semiconductor body 1 in the drift path 2. It is assumed that a voltage is applied between the electrodes 3, 4 and creates an electrical field of the same magnitude as the breakdown field strength. For a conventional semiconductor component without the regions 5, the field strength E for the same doping level in the drift path 2 would then have the profile shown by a dashed line, while the semiconductor component according to an embodiment results in an electrical field profile corresponding to the solid line.

Conversely, the profile of the electrical field corresponding to the solid line for a conventional semiconductor component without the regions 5 is obtained only with considerably weaker doping of the drift path, and thus with a considerably higher forward resistance.

FIG. 1A accordingly shows that the measure according to an embodiment, specifically, the introduction of the high-k regions 5, makes it possible to combine a high breakdown voltage with a high drift path doping level.

Figure 2:
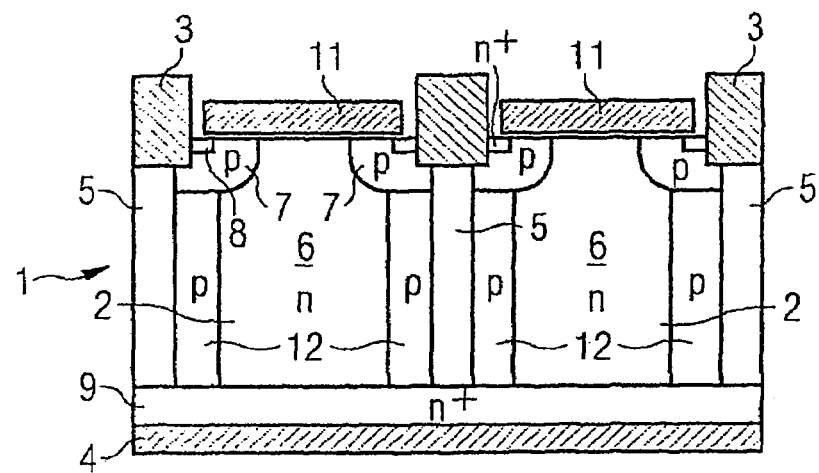
FIG. 2 shows a section illustration of a power MOSFET according to a further embodiment, with structures for charge compensation also being provided here.

FIG. 2 shows a further embodiment of the semiconductor component according to an embodiment, specifically a power MOSFET, in which, in addition to the embodiment shown in FIG. 1, compensation structures are provided in the form of p-conductive compensation regions 12. The compensation regions 12 are p-conductive and are sufficiently heavily doped that the n-conductive charge in the regions 6 is essentially compensated for. The laterally integrated p-charge must in this case remain less than the breakdown charge. In consequence, the doping of the drift path 2 can be appropriately increased, and the forward resistance can be further reduced. The doping level in the regions 12 need not, however, be set as accurately as is the case with pure compensation components.

In order to ensure that the maximum electrical field strength does not reach the vicinity of one end of the drift path 2, but is located in its interior, for example approximately at its center, the p-doped compensation regions 12 in the source-end area of the drift path 2 may be more heavily doped than the n-doped drift path 2, or those in the drain-end area of the drift path 2 may be more lightly doped than the n-doped drift path 2. This can be achieved not only by vertical variation of the doping in the compensation regions 12, but also by vertical variation of the doping in the drift path 2. Semiconductor components such as these are distinguished by high avalanche resistance and current load capacity in breakdown, as well as by increased tolerance to manufacturing fluctuations.

Figure 3:
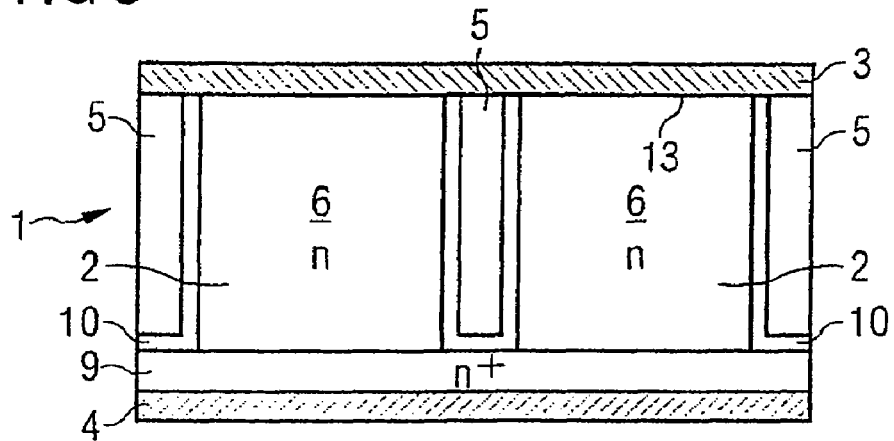
FIG. 3 shows a section illustration through a Schottky diode according to a further embodiment.
Figure 4:
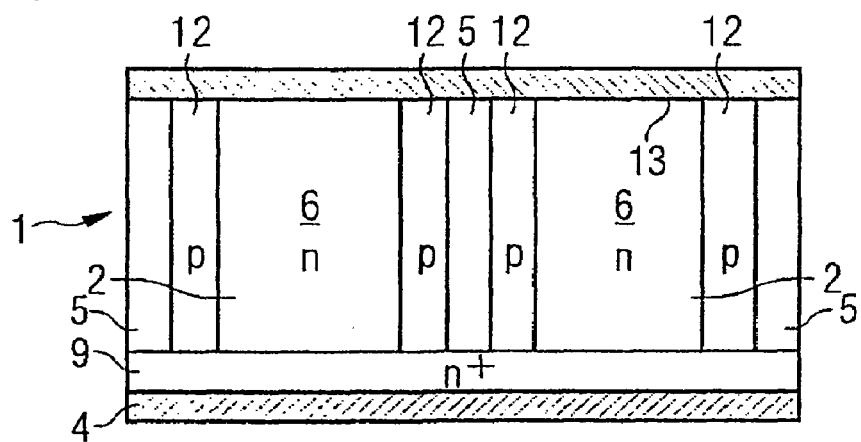
FIG. 4 shows a section illustration through a Schottky diode according to a further embodiment, with additional compensation regions being provided here.
Figure 5:
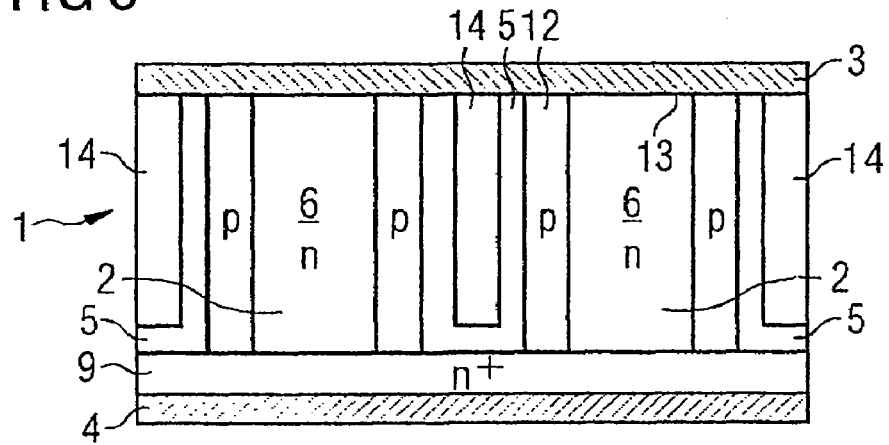
FIG. 5 shows a section illustration through a Schottky diode according to a further embodiment, with compensation regions additionally being provided here, and with the trenches with high-k material also being filled with insulating material.

As further embodiments, FIGS. 3, 4 and 5 each show a Schottky diode with a Schottky contact 13 between the first electrode 3 and the semiconductor body 1. In FIG. 3, the high-k material region 5 is separated from the semiconductor regions 6 by an isolator layer 10 composed, for example, of silicon dioxide, while in FIG. 4 compensation regions 12 (in a similar manner to those in FIG. 2) are provided in the drift path 2, and in FIG. 5 the trenches 18 are partially filled with insulating material 14 in addition to the high-k material 5.

Figure 6A:
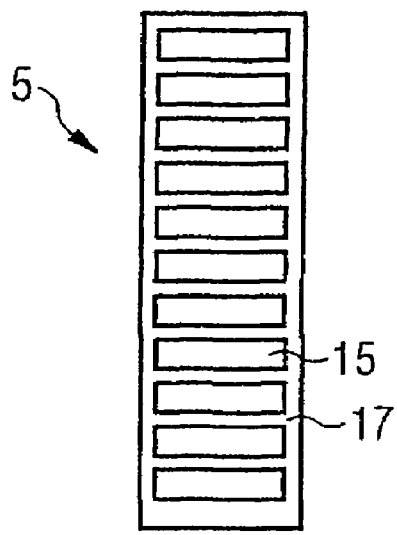
FIGS. 6A and 6B show section illustrations of various structures of the high-k material regions.
Figure 6B:
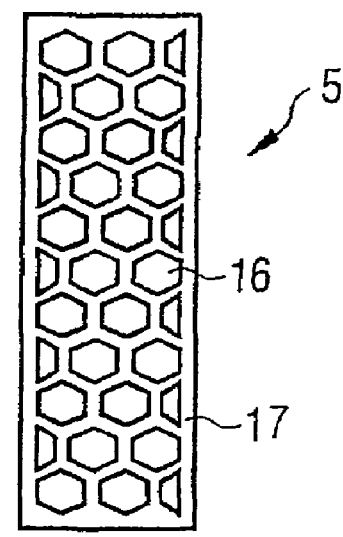

FIGS. 6A and 6B show vertical cross sections through high-k material regions, in which a high-k material 5 is formed as an alternative to a homogenous volume material. In this case, the high-k material 5 is an assembled material formed in places by layers one above the other, in which regular or irregular conductive regions in the form of layers 15 or material areas 16 are surrounded by a dielectric 17. The layers 15 and material areas 16 may, for example, be composed of metal or of a semiconductor, while a high-k material, for example as has already been stated above, is chosen for the dielectric 17. This makes it possible to increase the effective dielectric constant of the high-k material region 5 that has been structured in this way. In this case, a material with a low dielectric constant $\epsilon_r$ between $20 \leq \epsilon_r \leq 200$ is therefore also suitable for use as the dielectric 17.

Figure 7:
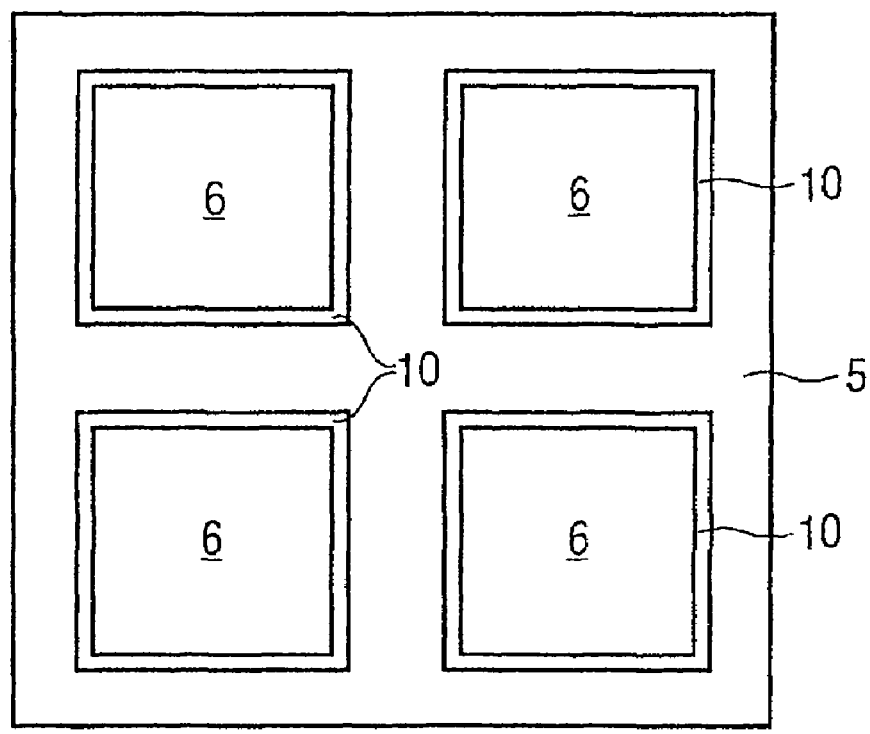
FIG. 7 shows a horizontal section through the drift path of the MOSFET shown in FIG. 1, with a grating structure of the high-k material regions.
Figure 8:
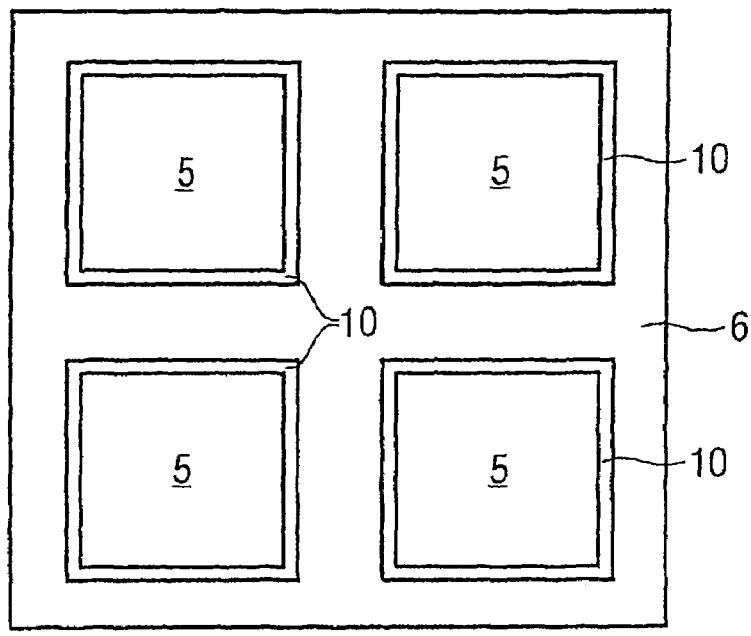
FIG. 8 shows a horizontal section through the drift path of the MOSFET shown in FIG. 1, with a column structure of the high-k material regions.

FIGS. 7 and 8 show horizontal section illustrations of two embodiment options for the drift path 2 of the power MOSFET for the embodiment in FIG. 1. In this case, the high-k material region 5 in FIG. 7 has a grating structure, while a column structure is provided for this purpose in FIG. 8. However, other structures are, of course, also possible.

Figure 9:
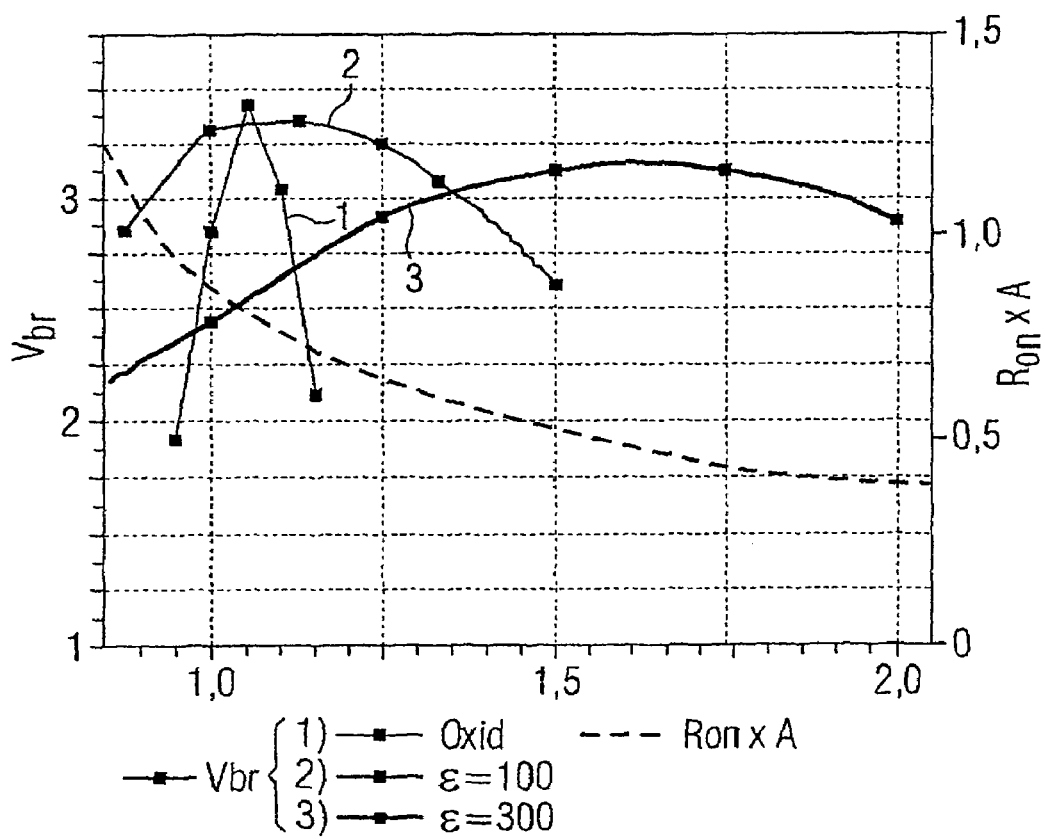
FIG. 9 shows the relationship between the breakdown voltage and the forward resistance on the one hand and the doping concentration in the drift path on the other hand for a power MOSFET similar to that in FIG. 2.

FIG. 9 shows the relationship between the breakdown voltage Vbr (solid line) and the forward resistance Ron*A (dashed line) on the one hand and the doping concentration in the drift path 2 (epi-doping) on the other hand, in relative units for a power MOSFET, similar to that in FIG. 2, for silicon dioxide (curve 1), a high-k material whose dielectric constant is $\epsilon_r$=100 (curve 2) and a high-k material whose dielectric constant is $\epsilon_r$=300 (curve 3). Relative units are in this case indicated on both the abscissa and the ordinates. While the forward resistance Ron*A is reduced by about ⅓ when the doping is doubled, the breakdown voltage retains relatively high values when a high-k material for which $\epsilon_r$=100 (curve 2) or even $\epsilon_r$=300 (curve 3) is used in the regions 5 instead of silicon dioxide.

Figure 10:
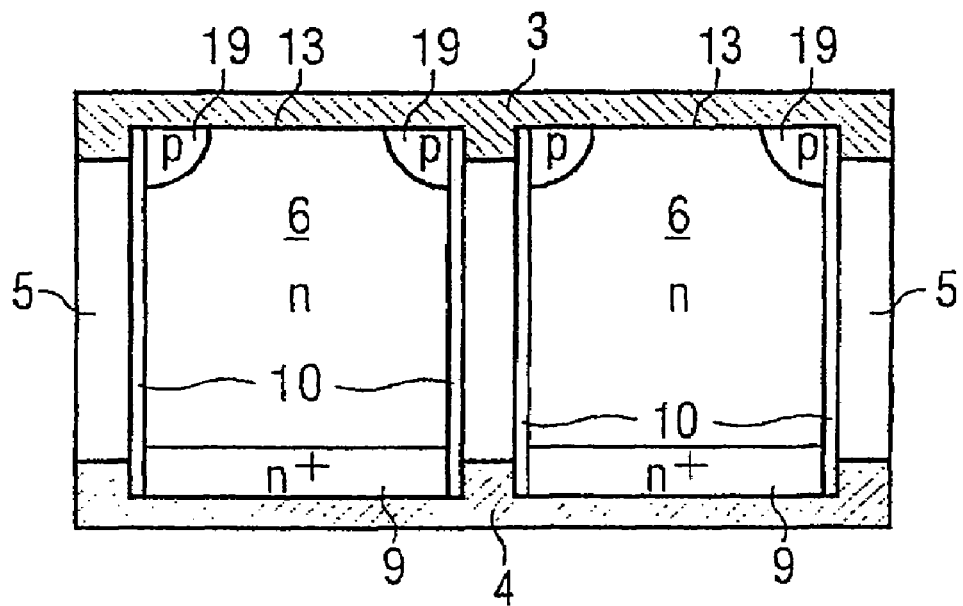
FIG. 10 shows a section illustration through a Schottky diode according to a further embodiment, with layers which are separated from the semiconductor material by oxide and are composed of a material with a high dielectric constant, which is connected directly to the metallization or metallic material on the front face and rear face, and having p-doped regions in order to reduce the electrical field at the Schottky contact.

In the embodiment in FIG. 10, as is normal in the case of Schottky diodes, the electrical field at the Schottky contact 13 is reduced by means of p-conductive regions 19 on the front face. In the embodiments in FIGS. 10 and 11, which show a Schottky diode and a power MOSFET, respectively, and which largely correspond to the embodiments in FIGS. 3 and 2, respectively, the high-k material regions 5 on the front face and on the rear face are connected directly to the metallization 3 of the anode and the metallization 4 of the cathode or metallic material, without there being any semiconductor region between the respective metallization 3 or 4 and the high-k material 5. A structure such as this is particularly advantageous when the thermal coefficients of expansion of the semiconductor material and of the high-k material differ considerably.

Figure 12:
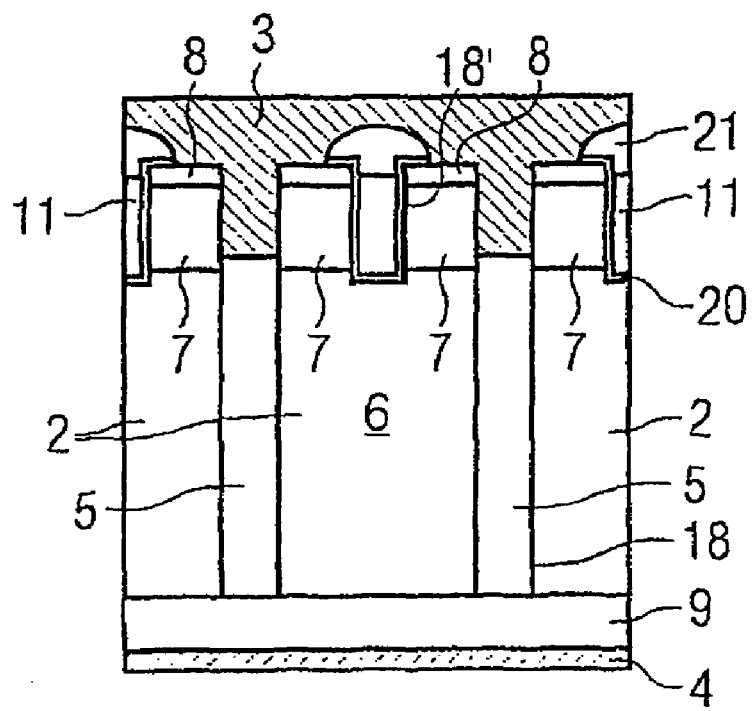
FIG. 12 shows a section illustration through a trench-DMOS transistor according to a further embodiment, with the gate electrode being introduced into a trench such that it is isolated by a gate oxide, and cutting completely through the body zone and the source zone.

As one embodiment, FIG. 12 shows a trench-DMOS transistor, in which a gate electrode 11 composed for example of polycrystalline silicon is incorporated in a trench 18', which is clad on its side and bottom surfaces with an isolator layer 20 preferably composed of silicon dioxide. This trench 18' cuts completely through the source zone 8 and the body zone 7, and thus extends as far as the drift path 2. The drift path 2 itself has high-k regions 5 passing through it, which are themselves located in trenches.

In the embodiment shown in FIG. 12, the high-k regions 5 do not start directly at the semiconductor surface, but in fact in the depth of the reverse-biased pn junction between the body zone 7 and the drift path 2. This avoids excessively high electrical field strength peaks occurring, which would reduce the breakdown voltage. The gate electrodes 11 are still electrically isolated from the source/body electrode 3 by an isolator layer 21 composed of silicon dioxide or silicon nitride.

Figure 13:
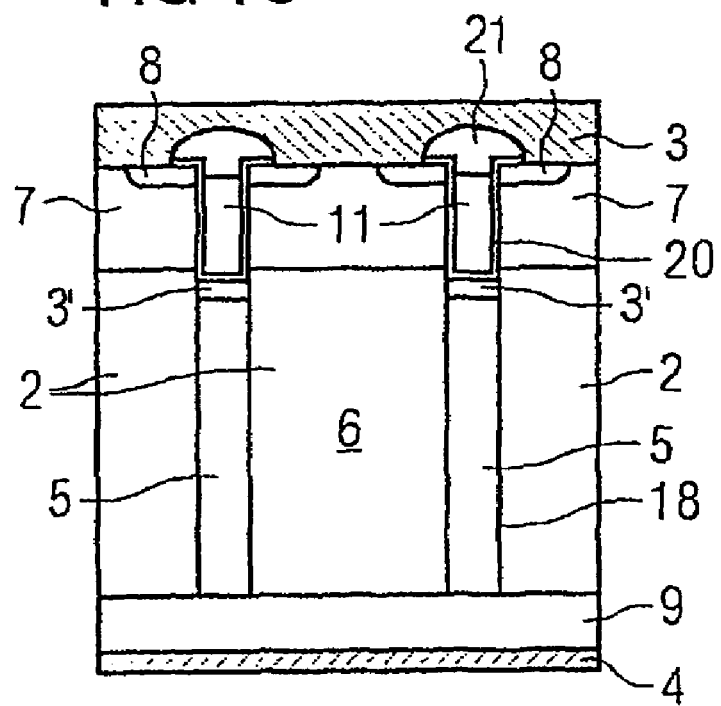
FIG. 13 shows a section illustration through one variant of the embodiment shown in FIG. 12, with the trench gate in this case being provided in the trench in which the high-k material is also located, and with a further source electrode being arranged on the high-k material.

FIG. 13 shows a variant of the embodiment in FIG. 12, in which the gate electrodes 11 and the high-k material regions 5 are provided in the same trenches 18, and the high-k material region 5 is equipped with a further source electrode 3'. This further source electrode 3' can be electrically connected to the source electrode 3. The variant of the embodiment in FIG. 13 is particularly space-saving in comparison to the embodiment in FIG. 12, since there is no need in this case to provide any separate trenches for gate electrodes and high-k material regions.

As an alternative to the embodiments in FIGS. 12 and 13, it is also possible to connect the high-k material region 5 to the gate potential via the gate electrode 11. In this case, a thin isolating or conductive barrier 22 can be provided between the high-k material region and the gate electrode 11, as is illustrated in the left-hand half of FIG. 14. By way of example, silicon dioxide can be used for an isolating barrier 22, while a conductive barrier may be composed of metal.

Figure 15:
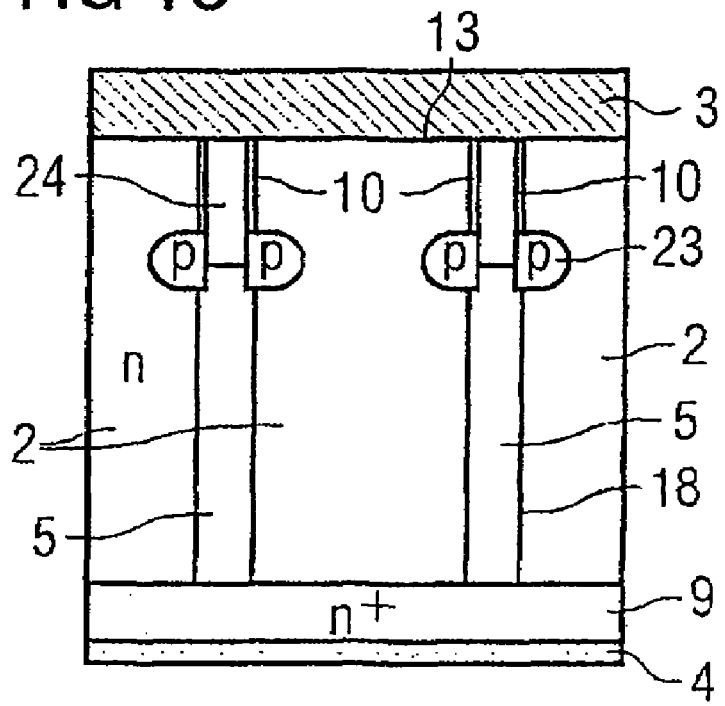
FIG. 15 shows a section illustration through a PIN-Schottky diode according to a further embodiment, in which the p-doping is conductively connected to the metal of the anode via the trench of the high-k material.
Figure 16:
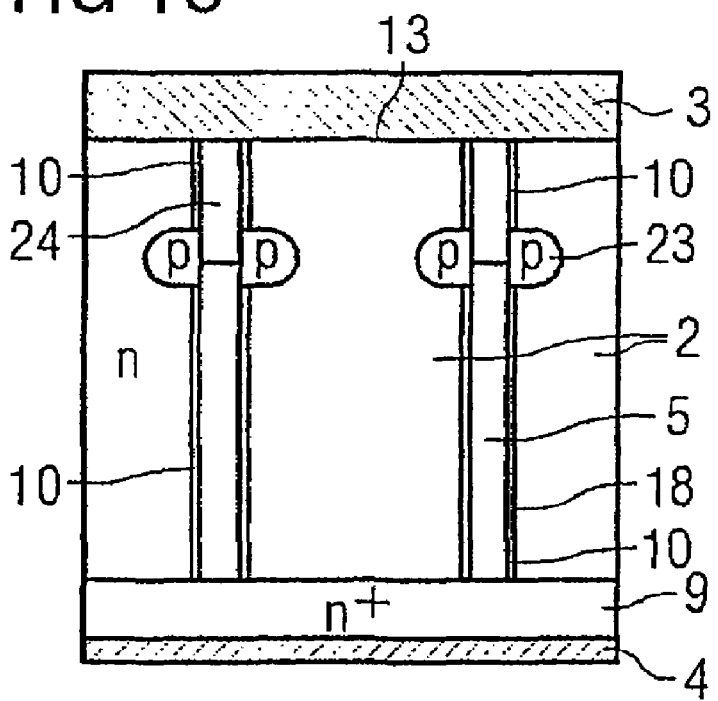
FIG. 16 shows a section illustration through one variant of the embodiment in FIG. 15, in which the high-k material is surrounded by an isolating layer.

FIGS. 15 and 16 also show two further embodiments, each having a PIN-Schottky diode, which has a similar structure to a TOPS diode. In the case of this Schottky diode, a p-doped area 23 in the wall area of the trenches 18 is conductively connected to an anode electrode 3 via a conductor 24. Polycrystalline silicon can preferably be used for the conductor 24. This conductor 24 is separated from the n-conductive semiconductor region 2 by an isolator layer 10.

High-k material regions 5 which, as shown in FIG. 15, may be directly adjacent to the semiconductor regions 2 or may be separated from them by an isolator layer 10 corresponding to FIG. 16, are located in the lower area of the trenches 18. One major advantage of the diodes in FIGS. 15 and 16 is that the Schottky junction 13 is well shielded from strong fields, since the p-doped areas 23, which are in the form of islands, are located deeper in the trenches 18.

Figure 14:
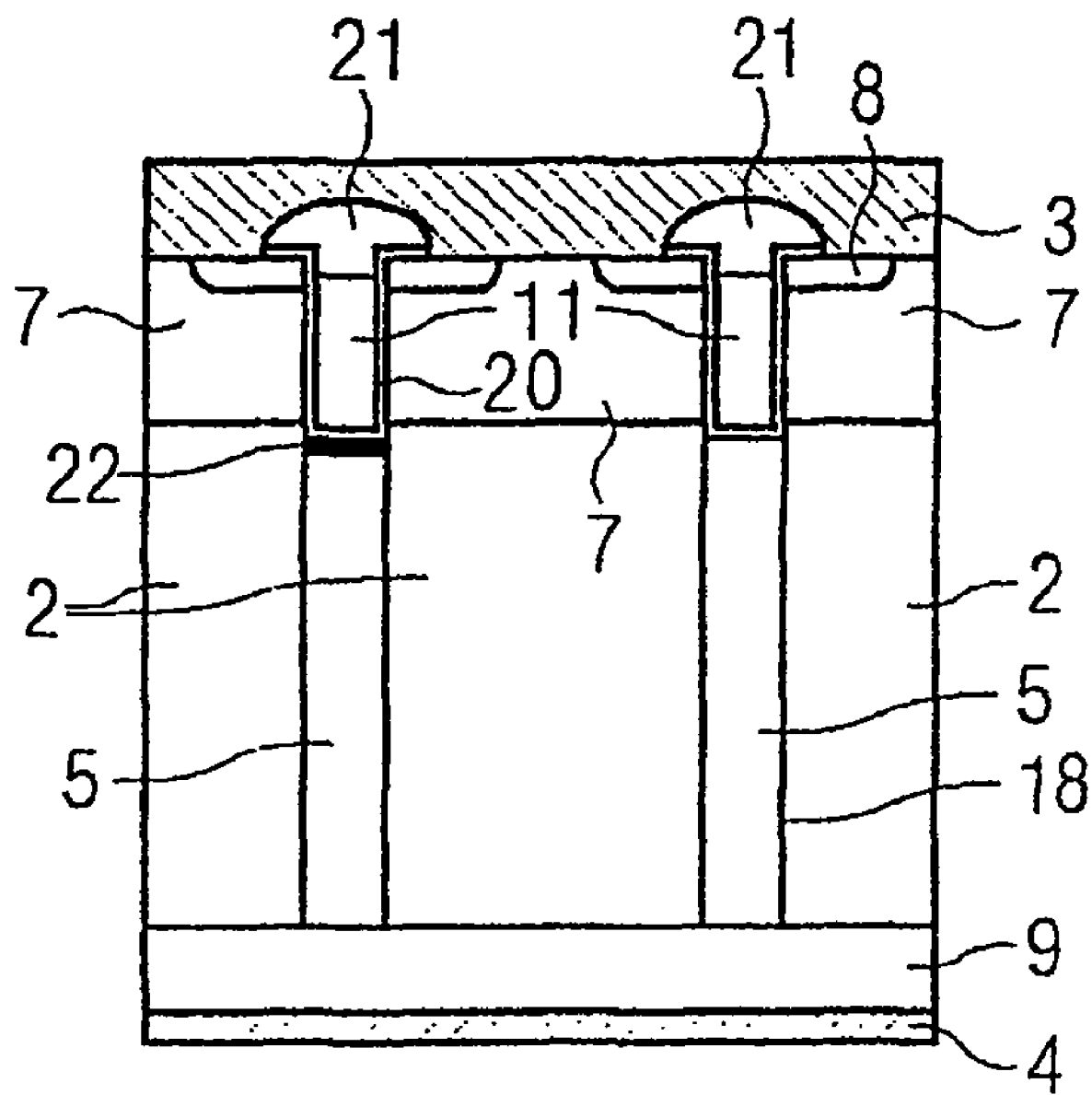
FIG. 14 shows an alternative to the embodiment in FIG. 13, with the high-k material in this case having the gate potential applied to it via the gate electrode, and with a thin isolating or conductive barrier being provided between the high-k material and the gate electrode.

The embodiments in FIGS. 15 and 16 can be implemented in a relatively simple manner, since the same trenches can be used in a similar manner to that in the embodiment in FIGS. 13 and 14 for the trenches for the high-k material regions 5 and for the p-doped areas 23.

What is claimed is:

1. A semiconductor component comprising a drift path which is formed in a semiconductor body and composed of a semiconductor material of a first conductivity type and comprises a trench structure, which is arranged between at least one first and one second electrode and at least along a part of the drift path, in the form of at least one trench, wherein a plurality of conductive regions are disposed in the trench structure, each conductive region being surrounded by a high-k dielectric material disposed in the trench structure, the high-k dielectric material having a relative dielectric constant $\epsilon_r$ where $\epsilon_r \geq 20$ such that at least one high-k material region and one semiconductor material region of the first conductivity type are arranged in the area of the drift path.

2. A semiconductor component according to claim 1, wherein the trench structure comprises a plurality of high-k material regions, which alternate with semiconductor material regions of the drift path, along the drift path.

3. A semiconductor component according to claim 1, wherein the extent of the semiconductor material region from one high-k material region to a next high-k material region is not more than about ⅓ of the extent of the semiconductor material region in the current-flow direction between the first and the second electrodes.

4. A semiconductor component according to claim 1, wherein the semiconductor component is a MOSFET, a JFET or a Schottky diode.

5. A semiconductor component according to claim 1, wherein the relative dielectric constant $\epsilon_r$ of the high-k dielectric material of the high-k material region is $\epsilon_r \geq 200$.

6. A semiconductor component according to claim 5, wherein the dielectric coefficient or the relative dielectric constant $\epsilon_r$ of the high-k dielectric material in the high-k material region is $\epsilon_r > 1000$.

7. A semiconductor component according to claim 1, wherein the dielectric constant of the high-k dielectric material of the high-k material region is at least greater than twice the value of the dielectric constant of the semiconductor material in the drift path.

8. A semiconductor component according to claim 1, wherein an isolator layer is provided at least in places between the high-k material region and the semiconductor material region of the semiconductor body.

9. A semiconductor component according to claim 8, wherein the isolator layer is composed of silicon dioxide, aluminum oxide or titanium dioxide, or of a stack comprising at least one silicon-dioxide film and/or one silicon-nitride film.

10. A semiconductor component according to claim 8, wherein the thickness of the isolator layer is at least ⅓ of the diameter of the conductive regions.

11. A semiconductor component according to claim 1, wherein the trench is etched as a trench structure into the semiconductor body.

12. A semiconductor component according to claim 1, wherein the drift path is adjacent to a heavily-doped region in the area of the second electrode, which is opposite one main surface of the semiconductor body.

13. A semiconductor component according to claim 12, wherein the high-k material region extends approximately as far as the heavily-doped region.

14. A semiconductor component according to claim 1, wherein compensation regions of the opposite conductance type to the first conductance type are provided in the drift path and, when the semiconductor component is switched off, at least partially compensate for the doping of the first conductance type in the drift path.

15. A semiconductor component according to claim 14, wherein the compensation regions and/or the semiconductor material regions, which are located between the compensation 15 regions, of the drift path comprise a variation in the doping in the direction between the first and the second electrode, in such a manner that the second conductance type predominates in the area of the first electrode, and the first conductance type predominates in the area of the second electrode.

16. A semiconductor component according to claim 14, wherein the high-k material regions which are located between compensation regions are connected directly between the first and the second electrode.

17. A semiconductor component according to claim 1, wherein the trench additionally contains insulating material.

18. A semiconductor component according to claim 1, wherein the high-k material in the high-k material region is composed of an assembled material.

19. A semiconductor component according to claim 18, wherein the assembled material contains conductive areas which are surrounded by a dielectric.

20. A semiconductor component according to claim 19, wherein the conductive areas are irregularly or regularly arranged material areas or layers.

21. A semiconductor component according to claim 19, wherein the thickness of the isolator layer is at least ⅓ of the diameter of the conductive areas.

22. A semiconductor component according to claim 1, wherein the high-k dielectric material in the high-k material region contains hafnium oxide, zirconium oxide, titanium dioxide or lanthanum oxide, or a compound from the group of titanates, in particular such as barium titanate, strontium titanate or barium-strontium titanate, or from the groups of zirconates, niobates or tantalates.

23. A semiconductor component according to claim 1, wherein the high-k material region has a strip, grating or column structure.

24. A semiconductor component according to claim 23, wherein the doping concentration in the drift path, integrated between two high-k material regions, in a direction at right angles to the main direction of the electrical field between the first and the second electrode when a reverse voltage is applied to the two electrodes, and at right angles to the boundary surface between the semiconductor material regions and the high-k material regions, is not greater than twice the breakdown charge in the case of a strip structure and is not greater than four times the breakdown charge in the case of a grating structure.

25. A semiconductor component according to claim 1, wherein the semiconductor component has a lateral structure in which the high-k material region is located in the trench structure and extends laterally between drain and source, and/or anode and cathode.

26. A semiconductor component according to claim 1, wherein the semiconductor material of the semiconductor body consists of homogenous semiconductor material, in particular such as silicon, silicon carbide, gallium arsenide, gallium nitride, carbon or heterogenous semiconductor material, in particular such as Si/SiGe, GaAs/AlGaAs, GaN/AlGaN, GaAs/InGaAsP or of organic or inorganic material.

27. A semiconductor component according to claim 1, wherein a metallically conductive layer is provided between the high-k material in the high-k material region and the semiconductor material of the semiconductor body, in the area of the second electrode, which is opposite one main surface of the semiconductor body.

28. A semiconductor component according to claim 27, wherein the metallically conductive layer makes contact with both the high-k material as a capacitance electrode and with the semiconductor material, and acts as a diffusion barrier.

29. A semiconductor component according to claim 1, wherein the high-k material in the high-k material region makes contact with the first electrode in the area of the first electrode, which is provided on the main surface of the semiconductor body.

30. A semiconductor component according to claim 1, wherein the high-k material in the high-k material region makes contact with the second electrode without any interposed semiconductor region, in the area of the second electrode, which is opposite one main surface of the semiconductor body.

31. A semiconductor component according to claim 1, wherein the first electrode is at the source potential or gate potential.

32. A semiconductor component according to claim 1, wherein the drift path has a doping concentration in the range from $2E15\ cm^{-3}$ to $1E17\ cm^{-3}$.

33. A semiconductor component according to claim 1, wherein the width of the drift path is in the range from 1 μm to 10 μm, preferably 2 μm to 4 μm.

34. A semiconductor component according to claim 1, wherein the length of the drift path in silicon for a breakdown voltage of about 600 V is approximately 40 μm.

35. A semiconductor component according to claim 1, wherein, in the case of a vertical structure, the high-k material region starts approximately at the same height as a reverse-biased pn junction between the first and the second electrode.

36. A semiconductor component according to claim 1, wherein if the semiconductor component is in the form of a Schottky diode, at least one high-k material region is separated from the drift path by an isolator layer.

37. A semiconductor component according to claim 1, wherein if the semiconductor component is in the form of a Schottky diode, regions of the opposite conductance type to the conductance type of the drift path are provided in the area of the Schottky contact.

38. A semiconductor component according to claim 1, wherein the gate electrodes and high-k material regions are arranged in separate trenches.

39. A semiconductor component according to claim 38, wherein the trenches of the gate electrodes pass through a body zone.

40. A semiconductor component according to claim 1, wherein the gate electrodes and high-k material regions are each located in the same trenches.

41. A semiconductor component according to claim 40, wherein the gate electrodes and the high-k material regions are separated from one another by an isolator layer.

42. A semiconductor component according to claim 41, wherein the high-k material region is provided with an additional electrode.

43. A semiconductor component according to claim 40, wherein the high-k material regions are connected to the gate electrode.

44. A semiconductor component according to claim 1, wherein regions of the opposite conductance type to the conductance type of the drift path are provided on the side wall of the trenches.

45. A semiconductor component according to claim 44, wherein the regions of the complementary conductance type are connected to the first electrode via conductors.

46. A semiconductor component according to claim 45, wherein the high-k material regions are provided essentially underneath the regions of the complementary conductance type in the trenches.

47. A semiconductor component according to claim 46, wherein the high-k material regions are separated from the drift path by an isolator layer.

48. A semiconductor component according to claim 1, wherein the plurality of conductive regions comprise regularly shaped and arranged conductive regions.

49. A semiconductor component according to claim 1, wherein the plurality of conductive regions comprise irregularly shaped and arranged conductive regions.

* * * * *

UNITED STATES PATENT AND TRADEMARK OFFICE
CERTIFICATE OF CORRECTION

PATENT NO. : 7,436,023 B2
APPLICATION NO. : 11/464004
DATED : October 14, 2008
INVENTOR(S) : Franz Hirler et al.

It is certified that error appears in the above-identified patent and that said Letters Patent is hereby corrected as shown below:

On the Title page, under Foreign Application Priority Data, please change "10 2004 007 197" to --10 2004 007 197.7--.

On the Title page, col. 2, under Other Publications, in the reference "H.-R. Chang et al.", please change "Conferemce" to --Conference--.

In the specification, claim 16, column 12, line 14, "GaN/AIGaN" should be --GaN/AlGaN--.

In the specification, claim 26, column 12, line 15, "GaAs/lnGaAsP" should be --GaAs/InGaAsP--.

Signed and Sealed this

Fourteenth Day of April, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,436,023 B2
APPLICATION NO. : 11/464004
DATED : October 14, 2008
INVENTOR(S) : Franz Hirler et al.

Page 1 of 1

It is certified that error appears in the above-identified patent and that said Letters Patent is hereby corrected as shown below:

On the Title page, under Foreign Application Priority Data, please change "10 2004 007 197" to --10 2004 007 197.7--.

On the Title page, col. 2, under Other Publications, in the reference "H.-R. Chang et al.", please change "Conferemce" to --Conference--.

In the specification, claim 26, column 12, line 14, "GaN/AIGaN" should be --GaN/AlGaN--.

In the specification, claim 26, column 12, line 15, "GaAs/lnGaAsP" should be --GaAs/InGaAsP--.

This certificate supersedes the Certificate of Correction issued April 14, 2009.

Signed and Sealed this

Thirtieth Day of March, 2010

David J. Kappos
*Director of the United States Patent and Trademark Office*